(12) United States Patent
Satoh et al.

(10) Patent No.: US 7,417,362 B2
(45) Date of Patent: Aug. 26, 2008

(54) FREQUENCY REGULATING METHOD FOR TUNING FORK TYPE VIBRATOR AND TUNING FORK TYPE VIBRATOR FREQUENCY-REGULATED BY THE METHOD

(75) Inventors: Syunsuke Satoh, Kakogawa (JP); Takashi Shirai, Kakogawa (JP)

(73) Assignee: Daishinku Corporation, Hyogo (JP)

( * ) Notice: Subject to any disclaimer, the term of this patent is extended or adjusted under 35 U.S.C. 154(b) by 130 days.

(21) Appl. No.: 10/514,943

(22) PCT Filed: Mar. 8, 2004

(86) PCT No.: PCT/JP2004/002985

§ 371 (c)(1),
(2), (4) Date: Nov. 18, 2004

(87) PCT Pub. No.: WO2004/100365

PCT Pub. Date: Nov. 18, 2004

(65) Prior Publication Data

US 2005/0225199 A1    Oct. 13, 2005

(30) Foreign Application Priority Data

Mar. 28, 2003  (JP) .............................. 2003-090067

(51) Int. Cl.
*H03H 9/21*  (2006.01)
(52) U.S. Cl. ....................... 310/370; 331/156
(58) Field of Classification Search ................. 310/370; 73/504.02; 331/156
See application file for complete search history.

(56) References Cited

U.S. PATENT DOCUMENTS

| | | | | |
|---|---|---|---|---|
| 3,697,766 A | * | 10/1972 | Ganter et al. | 310/348 |
| 4,320,320 A | * | 3/1982 | Momosaki et al. | 310/370 |
| 4,498,025 A | * | 2/1985 | Takahashi | 310/370 |
| 4,771,202 A | * | 9/1988 | Takahashi | 310/370 |
| 2001/0022488 A1 | * | 9/2001 | Kawauchi et al. | 310/370 |
| 2002/0113523 A1 | * | 8/2002 | Endoh | 310/344 |

FOREIGN PATENT DOCUMENTS

| | | | | |
|---|---|---|---|---|
| JP | 50-99692 | | | 8/1975 |
| JP | 63202113 | A | * | 8/1988 |
| JP | 11-195952 | | | 7/1999 |
| JP | 2001-85963 | | | 3/2001 |
| JP | 2002164759 | A | * | 6/2002 |
| JP | 2003133879 | A | * | 5/2003 |
| JP | 2003318685 | A | * | 11/2003 |
| JP | 2006086702 | A | * | 3/2006 |

* cited by examiner

*Primary Examiner*—Jaydi A San Martin
(74) *Attorney, Agent, or Firm*—Wenderoth, Lind & Ponack, L.L.P.

(57) ABSTRACT

A piezoelectric element of a tuning fork resonator comprises a base portion and a plurality of leg portions. Drive electrodes are formed on top and bottom major surfaces and both side surfaces of each leg portion. The drive electrodes have polarities different between on the top and bottom major surfaces and the both side surfaces. The drive electrodes on the side surfaces are connected to each other. Further, metal film for frequency adjustment is formed on a tip portion of each leg portion of the piezoelectric element. The frequency adjustment is performed by removing the metal film formed on at least one surface of side surfaces and a tip surface of the tip portion by beam irradiation.

15 Claims, 8 Drawing Sheets

FREQUENCY REGULATING METHOD FOR TUNING FORK TYPE VIBRATOR AND TUNING FORK TYPE VIBRATOR FREQUENCY-REGULATED BY THE METHOD

TECHNICAL FIELD

The present invention relates to a method for adjusting a frequency of a tuning fork resonator and a tuning fork resonator with a frequency adjusted by the method.

BACKGROUND ART

A production process of a tuning fork resonator (hereinafter referred to as a resonator) includes a step of adjusting an oscillation frequency. As a conventional resonator frequency adjusting method for this step, a method for adjusting the frequency of a resonator is disclosed in, for example, JP 2002-164759A.

A resonator disclosed in JP 2002-164759A is provided with a piezoelectric element (hereinafter referred to as an element) there within. The element includes a base portion and two leg portions. In addition, a metal film is provided on the top and bottom major surfaces of the two leg portions so as to adjust frequency.

In the resonator frequency adjusting method of JP2002-164759A, an oscillation frequency is adjusted by removing a portion of the top and bottom major surfaces of the metal film, which is provided as a weight for adjusting frequency on the top and bottom major surfaces of the leg portions of the element, by laser irradiation. Specifically, the metal film is irradiated with a laser to remove a portion of the metal film, thereby increasing the oscillation frequency of the resonator. The resultant oscillation frequency is measured. Laser irradiation and frequency measurement are repeatedly performed until the measured frequency value of the resonator reaches a target value. More specifically, when a YAG laser or the like is used, a portion of a metal film having a diameter of about 20 μm is removed by laser irradiation of a point on the metal film, resulting in a removal region (hereinafter referred to as a removal dot). Thus, the oscillation frequency of the resonator is increased by 2 to 3 ppm. Thus, each laser irradiation increases the oscillation frequency of the resonator by 2 to 3 ppm. The oscillation frequency is measured after each laser irradiation. When the measured frequency reaches a target value, the frequency adjustment procedure is ended.

In the above-described frequency adjusting method, the metal film on the top and bottom major surfaces of the leg portion is irradiated with a laser in a direction perpendicular thereto. Therefore, a plurality of removal dots are formed when rough adjustment is performed. Particularly when there is a relatively large difference between the oscillation frequency before adjustment and a target frequency, a large number of removal dots need to be formed. Unfortunately, in the above-described frequency adjusting method, the frequency adjustment procedure for the metal film on a limited region of the top and bottom major surfaces of the leg portion becomes unstable or the production efficiency of the resonator is decreased, in proportion to an increase in the number of removal dots.

Also, recently, there has been a demand for further miniaturization of resonators. In association with this, a smaller element is desired to be provided in a resonator. As the size of an element is reduced, the region of metal film for adjustment is also decreased. Therefore, it is difficult to use conventional resonator frequency adjusting methods to provide a large metal film frequency adjustment amount (rough adjustment) in a limited region of metal film for adjustment.

The present invention is provided to solve the above-described problems. It is an object of the present invention to stabilize the frequency adjustment procedure of the method for adjusting an oscillation frequency of a resonator by removing a portion of a metal film formed on the surface of an element, even if it is small, by beam irradiation, and to improve the production efficiency of the resonator.

DISCLOSURE OF INVENTION

Summary of the Invention

To achieve the above-described object, a frequency adjusting method for a tuning fork resonator according to the present invention is provided, in which the tuning fork resonator includes a piezoelectric element, the piezoelectric element includes a base portion, a plurality of leg portions and a metal film for frequency adjustment formed on each leg portion, and an oscillation frequency of the tuning fork resonator is adjusted by removing a portion of the metal film by beam irradiation. The frequency adjustment is performed by forming the metal film on a tip portion including at least one surface of side surfaces or tip surfaces of each leg portion, and removing the metal film formed on at least one surface of the side surfaces or the tip surfaces.

According to this invention, the frequency adjustment is performed by forming the metal film on a tip portion including at least one surface of side surfaces or tip surfaces of each leg portion, and removing the metal film formed on at least one surface of the side surfaces or the tip surfaces. Thus, it is possible to use more effectively a region of the metal film for adjustment, which is limited due to miniaturization of a piezoelectric element. Further, since an effective region can be secured on the metal film formed on the major surfaces, the metal film can be additionally removed with another fine adjustment technique (e.g., milling, partial deposition, etc.) in a subsequent step in a stable manner. Specifically, in the case of milling, after rough adjustment is performed by removing only the side surface using a laser, the entire metal film remaining on the major surface can be used as a weight for fine adjustment. Therefore, stable fine adjustment can be performed by removing the metal film. In the case of partial deposition, after rough adjustment is performed by removing only the side surface using laser, the entire metal film remaining on the major surface can be used as an underlying metal for fine adjustment. Therefore, stable fine adjustment can be performed by adding metal film.

In the above-described method, frequency adjustment may be performed by beam irradiation on an edge portion of at least one side in a width direction of the leg portion in a thickness direction of the leg portion so that the metal film formed on the side surface of the leg portion is removed in the shape of a line along a thickness direction.

In this case, in addition to the above-described operational effects, frequency adjustment is performed by beam irradiation on an edge portion of at least one side in a width direction of the leg portion in a thickness direction of the leg portion so that the metal film formed on the side surface of the leg portion is removed in the shape of a line along a thickness direction. Thus, it is possible to form a large removal dot on the metal film of the side surface in the shape of a line by performing beam irradiation once. Therefore, the efficiency of frequency adjustment is considerably improved, resulting in no variations in frequency adjustment. Thus, a considerably stable frequency adjustment procedure can be achieved.

Further, a predetermined amount of frequency adjustment can be secured on the metal film on the side surface of the leg portion irrespective of the size of the region of the metal film on the major surface of the leg portion. Therefore, a piezoelectric element can be miniaturized without reducing the efficiency of the frequency adjustment procedure.

In the above-described method, frequency adjustment may be performed by beam irradiation from one side surface in a width direction of the leg portion via the top and bottom major surfaces to the other side surface so that the metal film formed on the leg portion is removed in the shape of a line along a perimeter of the leg portion on the top and bottom major surfaces and the both side surface.

In this case, in addition to the above-described operational effect, since beam irradiation is performed from one side surface in a width direction of the leg portion via the top and bottom major surfaces to the other side surface, the metal film formed on the leg portion can be removed from not only the top major surface and both the side surfaces thereof but also the bottom major surface thereof, which is removed by the beam transmitted through the leg portion. Thus, by performing beam irradiation once, a portion of the metal film on the major surface of the leg portion can be removed in the shape of a line along a perimeter of the leg portion. Therefore, considerably efficient and stable frequency adjustment can be achieved without variation in frequency adjustment.

Further, a predetermined amount of frequency adjustment can be secured for the metal film on the major surface of the leg portion irrespective of the size of the region of the metal film on the major surface of the leg portion. The amount of frequency adjustment can be increased for miniaturized piezoelectric elements, thereby making it possible to dramatically increase the production efficiency of resonators.

In the above-described method, frequency adjustment may be performed by beam irradiation on an edge portion of the tip portion of the leg portion in a thickness direction of the leg portion so that the metal film formed on the tip surface of the leg portion is removed in the shape of a line in a thickness direction.

In this case, frequency adjustment is performed by beam irradiation on the edge portion of the tip portion of the leg portion in the thickness direction of the leg portion so that the metal film formed on the tip surface of the leg portion is removed in the shape of a line in the thickness direction. Therefore, in addition to the above-described operational effect, it is possible to form a large removal dot on the metal film of the side surface in the shape of a line by performing beam irradiation once. Therefore, the efficiency of frequency adjustment is considerably improved, resulting in no variations in frequency adjustment. Thus, a considerably stable frequency adjustment procedure can be achieved.

Further, a predetermined amount of frequency adjustment can be secured for the metal film of the leg portion tip surface without any influence of the size of the region of the metal film on the major surfaces of the leg portion. Therefore, a piezoelectric element can be miniaturized without a reduction in the efficiency of frequency adjustment.

In the above-described method, frequency adjustment may be performed by beam irradiation of the tip surface and the top and bottom major surfaces of the leg portion so that the metal film formed on the leg portion is removed in the shape of a line extending on the top and bottom major surfaces and the tip surface.

In this case, when the tip surface and the top and bottom major surfaces of the leg portion are subjected to beam irradiation, not only the top major surface and the tip surface but also the bottom major surface of the metal film of the leg portion can be removed. Since the bottom major surface is removed by a light beam transmitting through the leg portion, portions on the top and bottom major surfaces and the tip surface can be removed in the shape of a line from a portion of the metal film of the leg portion by performing beam irradiation once. Thus, in addition to the above-described operational effect, no variation in frequency adjustment occurs, resulting in a considerably efficient and stable frequency adjustment procedure.

Further, a predetermined amount of frequency adjustment can be secured for the metal film of the major surface of the leg portion without any influence of the size of the region of the metal film on the major surfaces of the leg portion. Therefore, the frequency adjustment amount of a miniaturized piezoelectric element can be increased, resulting in a dramatic improvement in the production efficiency of resonators.

The method may have a rough adjustment step of performing rough frequency adjustment by beam irradiation on the metal film formed on the leg portion so that the metal film is removed in the shape of a line, and a fine adjustment step of performing selectively any one or more of first fine frequency adjustment for removing the metal film in the shape of a line and second fine frequency adjustment for removing the metal film in the shape of a dot.

In this case, the method has the rough adjustment step of performing rough frequency adjustment and the fine adjustment step of performing selectively the first fine frequency adjustment having a relatively large adjustment amount and the second fine frequency adjustment having a relatively small adjustment amount. Therefore, in addition to the above-described operational effect, a smaller number of times of frequency adjustment can achieve a target frequency, and frequency adjustment can be performed very efficiently and quickly. Further, by combining the rough frequency adjustment and the two patterns of fine frequency adjustment, the oscillation frequency can be adjusted with considerably high resolution. Thus, high-precision frequency adjustment can be achieved. Furthermore, when these frequency adjustment steps are performed at locations having different distances from the tip of the leg portion of the piezoelectric element, a combination of these locations improves the resolution, resulting in higher-precision frequency adjustment.

The method may have a rough adjustment step of performing rough frequency adjustment by beam irradiation on the metal film formed on the leg portion so that the metal film is removed in the shape of a line, and a fine adjustment step of performing simultaneously first fine frequency adjustment for removing the metal film in the shape of a line and second fine frequency adjustment for removing the metal film in the shape of a dot.

In this case, the method has the rough adjustment step of performing rough frequency adjustment and the fine adjustment step of performing simultaneously the first fine frequency adjustment having a relatively large adjustment amount and the second fine frequency adjustment having a relatively small adjustment amount. Therefore, in addition to the above-described operational effect, a smaller number of times of frequency adjustment can achieve a target frequency, and frequency adjustment can be performed very efficiently and quickly. Further, by combining the rough frequency adjustment and the two patterns of fine frequency adjustment, the oscillation frequency can be adjusted with considerably high resolution. Thus, high-precision frequency adjustment can be achieved. Furthermore, when these frequency adjustment steps are performed at locations having different distances from the tip of the leg portion of the piezoelectric element, a combination of these locations improves the resolution, resulting in higher-precision frequency adjustment. In addition, since the first fine frequency adjustment and the second fine frequency adjustment are performed simultaneously, the number of times of frequency measurement can be reduced as compared to when any one or more of the first fine frequency adjustment and the second fine frequency adjustment are performed selectively, resulting in a reduction in the time required for the frequency adjustment procedure.

In the above-described method, specifically, the first fine frequency adjustment may be performed so that the metal film closer to the base portion than the rough adjustment region is removed in the shape of a line. The second fine frequency adjustment may be performed so that the metal film closer to the base portion is removed in the shape of a dot. It is preferable that the fine adjustment step is performed after the rough adjustment step in the frequency adjustment steps. The present invention is not limited to this. The order of the steps may be arbitrarily changed.

In this method, the first fine frequency adjustment is performed so that the metal film closer to the base portion than the rough adjustment region is removed in the shape of a line. The second fine frequency adjustment is performed so that the metal film closer to the base portion is removed in the shape of a dot. Therefore, in the above-described operational effect, the rough frequency adjustment can be easily made different from the first fine frequency adjustment and the second fine frequency adjustment. By combining the rough frequency adjustment and the first and second fine frequency adjustment, high-precision frequency adjustment can be performed quickly.

In the above-described method, a width of the line may be changed.

In this case, by changing the width of the line, the range of frequency adjustment can be easily modified.

As described above, in the frequency adjusting method for a tuning fork resonator according to the present invention, it is possible to obtain a stable frequency adjustment procedure and improve the production efficiency of a small tuning fork resonator. Particularly, frequency adjustment is highly efficiently performed continuously for each piezoelectric element before the small piezoelectric element is cut off from a wafer (a crystal wafer, etc.) in which the piezoelectric elements are integrated together.

Further, in order to achieve the above-described object, the tuning fork resonator of the present invention is obtained by frequency adjustment using the above-described frequency adjusting method for a tuning fork resonator.

According to the present invention, it is possible to provide a tuning fork resonator capable of emitting a transmission signal having a frequency equal to a target frequency. Further, a frequency adjustment procedure can be performed more quickly and the production efficiency of a resonator can be improved, resulting in a low-cost tuning fork resonator.

Detailed Description of the Invention

Hereinafter, embodiments of the present invention will be described with reference to the accompanying drawings. A tuning fork resonator will be described before explaining a frequency adjusting method of the embodiments. Hereinafter, embodiments of the present invention will be described with reference to the accompanying drawings. It should be noted that, in the following embodiments, the present invention is applied to a crystal resonator as a tuning fork resonator, and the present invention is applied to a tuning fork crystal element as a piezoelectric element. However, the present invention is not limited to this. The crystal resonator and the tuning fork crystal element are preferable illustrative embodiments.

Description of Crystal Resonator (Tuning Fork Resonator as Described Herein)

Figure 1:
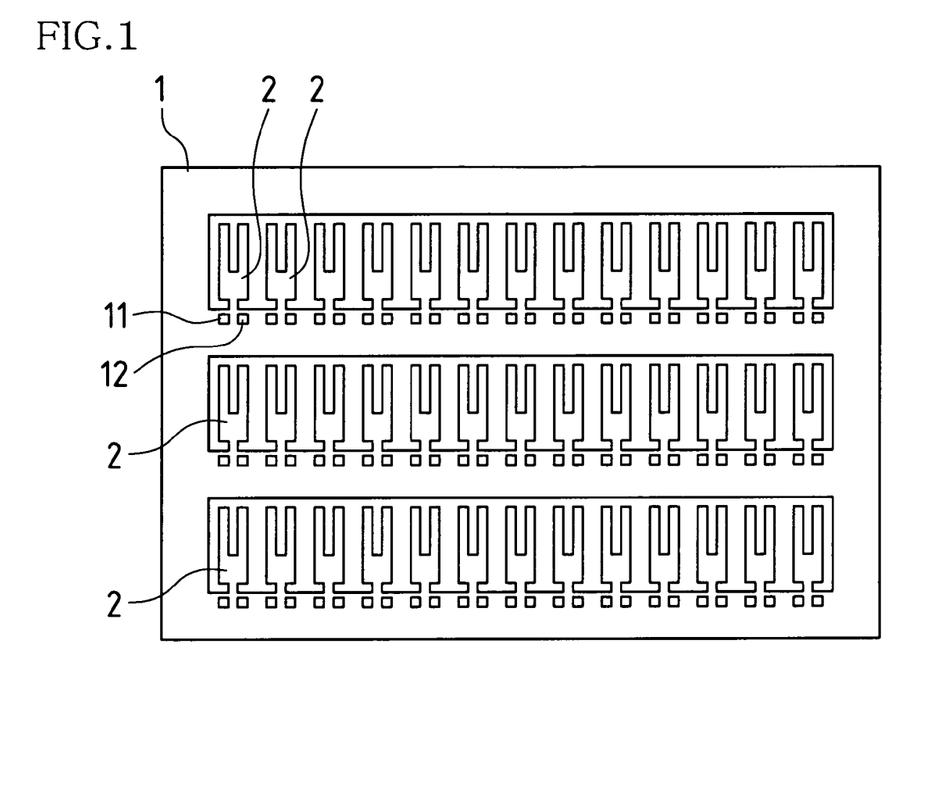
FIG. 1 is a plan view showing a crystal wafer according to the embodiment.
Figure 2:
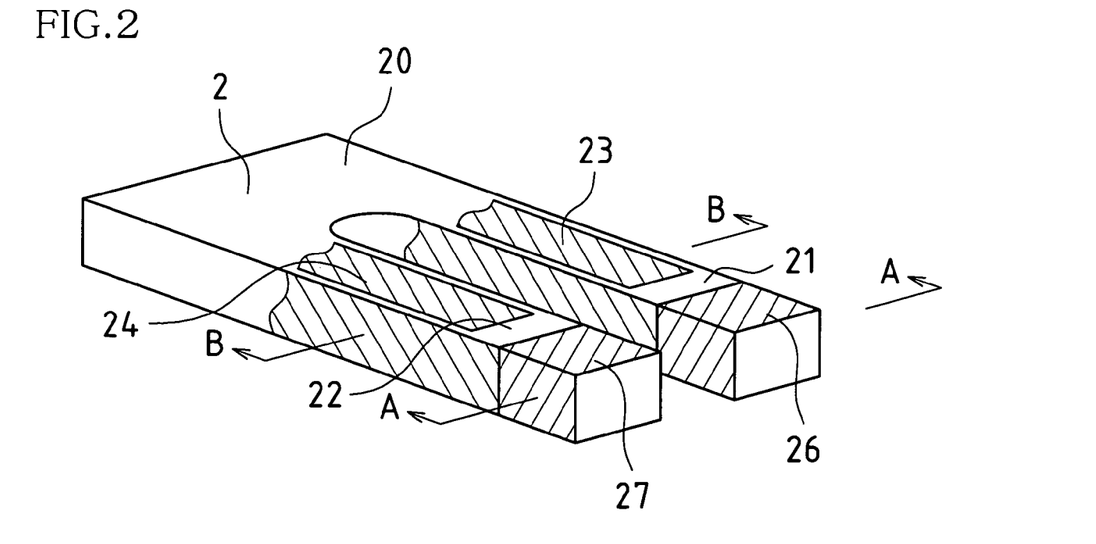
FIG. 2 is a diagram schematically showing one tuning fork crystal element of the crystal wafer 1 of FIG. 1.
Figure 3:
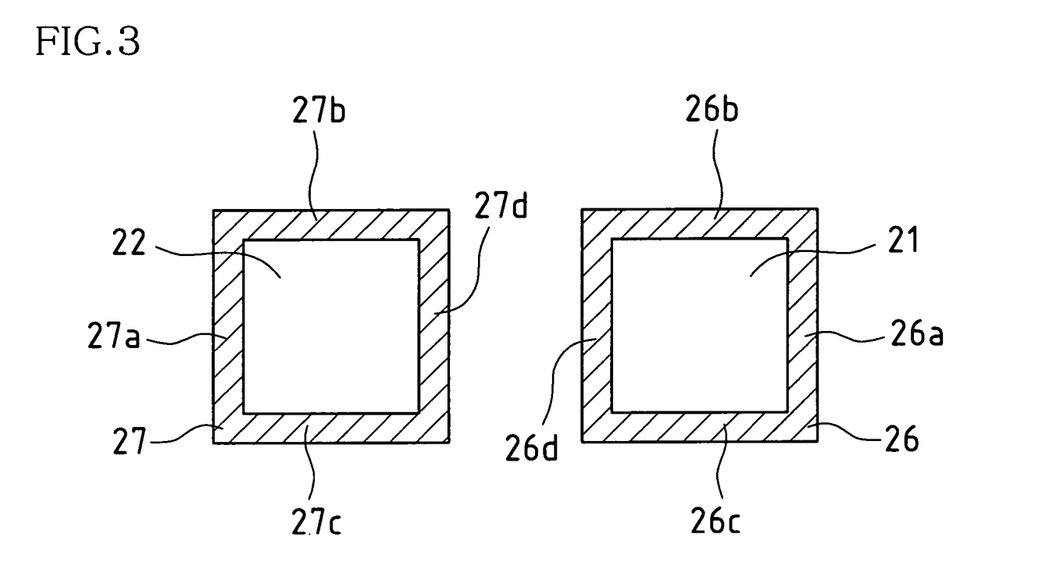
FIG. 3 is a cross-sectional view, taken along line A-A of FIG. 2.
Figure 4:
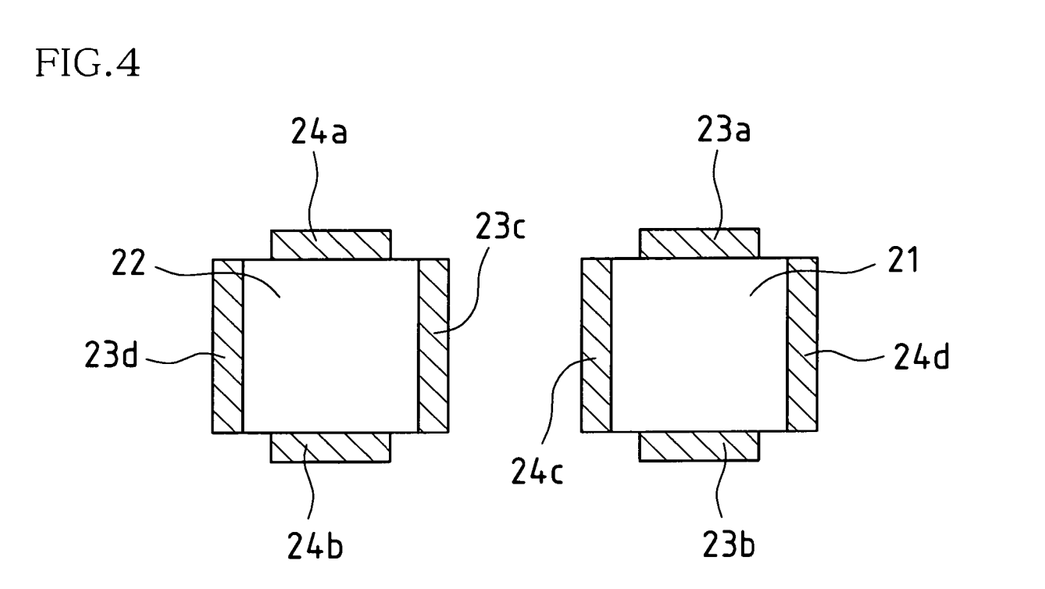
FIG. 4 is a cross-sectional view, taken along line B-B of FIG. 2.

FIG. 1 is a plan view showing a crystal wafer 1 according to the embodiment described herein. FIG. 2 is a diagram schematically showing one tuning fork crystal element 2 (hereinafter referred to as a crystal element) of the crystal wafer 1 of FIG. 1, indicating how first and second drive electrodes 23, 24 (described below) are disposed. FIG. 3 is a cross-sectional view, taken along line A-A of FIG. 2. FIG. 4 is a cross-sectional view, taken along line B-B of FIG. 2.

On a sheet of crystal wafer 1, a plurality of crystal elements 2, 2,... are formed using a technique, such as photolithography or the like. Before cutting off these crystal elements 2, 2, ..., the first and second drive electrodes 23, 24 and frequency adjustment metal films 26, 27 are formed on each crystal element 2, 2..... Further, test electrodes 11, 12 corresponding to each crystal element 2, 2, ..., are provided for each crystal element 2, 2... The test electrodes 11, 12 are connected to the first and second drive electrodes 23,24 via a conductive pattern (not shown). In the crystal wafer 1, voltage is applied via the test electrodes 11, 12 to the first and second drive electrodes 23, 24 of the crystal element 2 to be subjected to frequency adjustment, so that the crystal element 2 is excited. A frequency of the excited crystal element 2 can be measured. It should be noted that a crystal resonator is produced by mounting the crystal element 2 having the first and second drive electrodes 23,24 on a package (not shown) and attaching a planar cap (not shown) on a top of the package in a manner that covers the crystal element 2 to hermetically seal it.

Further, as shown in FIG. 2, each crystal element 2 formed on the crystal wafer 1 includes a base portion 20 and two leg portions 21, 22. The first and second drive electrodes 23, 24 are formed on the leg portions 21, 22, respectively. The first exciting electrode 23 includes top and bottom major surface drive electrodes 23a, 23b on the leg portion 21 and both side surface drive electrodes 23c, 23d on the leg portion 22. These first drive electrodes 23a, 23b, 23c, 23d are connected together. Similarly, the second exciting electrode 24 includes top and bottom major surfaces drive electrodes 24a, 24b on the leg portion 22 and both side surface drive electrodes 24c, 24d on the leg portion 21. These second drive electrodes 24a, 24b, 24c, 24d are connected together. The first and second drive electrodes 23, 24 are made of a thin film comprising, for example, chromium (Cr) formed on the leg portion 21, 22 by metal deposition and gold (Au) formed on a top of the chromium by a technique, such as photolithography or the like. A thickness of the thin film includes 0.02 μm of chromium and 0.40 μm of gold.

Further, as shown in FIG. 3, the metal films 26, 27 are formed as weights for frequency adjustment on respective tip portions of the leg portions 21, 22 of the tuning fork crystal element 2. The metal films 26, 27 are connected to the first drive electrodes 24c, 24d and the second drive electrodes 23c, 23d, respectively.

The metal film 26 includes an outer side surface metal film 26a formed on an outer side surface of the leg portion 21, a top major surface metal film 26b on a top surface thereof, a bottom major surface metal film 26c formed on a bottom surface thereof, and an inner side surface metal film 26d formed on an inner side surface thereof. The metal film 27 includes an outer side surface metal film 27a formed on an outer side surface of the leg portion 22, a top major surface metal film 27b formed on a top surface thereof, a bottom major surface metal film 27c formed on a bottom surface thereof, and an inner side surface metal film 27d formed on an inner side surface thereof. These metal films 26, 27 are made of thin film comprising, for example, chromium (Cr) formed on the leg portion 21, 22 by metal deposition and gold (Au) formed on a top of the chromium by a technique, such as photolithography or the like. A thickness of the thin film includes 0.02 μm of chromium, 0.40 μm of gold, and 2.00 μm of silver. In this embodiment, the chromium and gold layers of the metal films 26, 27 are formed contiguous to the first and second drive electrodes 23, 24.

A portion of the metal films 26, 27 is removed by beam irradiation using a beam irradiation instrument provided in a frequency adjustment apparatus described below to adjust an oscillation frequency of the resonator 1. To this end, the metal films 26, 27 are formed so that the oscillation frequency of the resonator 1 before frequency adjustment is lower than a target frequency.

Description of Frequency Adjustment Operation

Next, a frequency adjusting method for the thus-constructed crystal element 2 will be described where the beam irradiation is, for example, laser beam irradiation. Although a frequency adjustment apparatus described below is used herein, the present invention is not limited to this. The embodiments herein are only for illustrative purposes. A frequency adjustment apparatus in other forms may be used for beam irradiation.

A vacuum chamber (not shown) is used herein in the frequency adjustment apparatus (not shown) for the crystal element 2 of this embodiment. The vacuum chamber includes a process compartment (not shown) in which the crystal wafer 1 is placed on a frequency adjustment table (not shown) and frequency adjustment is performed, and a front compartment (not shown) having a door for transporting the crystal wafer 1 from the outside into the process compartment. The process compartment and the front compartment are connected to each other. Further, the frequency adjustment apparatus includes an image recognition apparatus (not shown) for recognizing a position of the crystal wafer 1, a controller (not shown) for controlling the frequency adjustment apparatus, a frequency multiplier (not shown) for multiplying an oscillation frequency of the crystal element 2, and a laser irradiation instrument (not shown) for emitting laser.

Preparation Before Laser Irradiation

The crystal wafer 1, whose oscillation frequency is to be adjusted, is transported from the outside into the front compartment of the vacuum chamber. Thereafter, the door of the front compartment is closed and the vacuum chamber is evacuated. When the crystal wafer 1 is transferred from the front compartment to the frequency adjustment table, the image recognition apparatus takes an image of the crystal wafer 1. The resultant image data is transmitted to the controller. Based on the image data, the position of each crystal element 2, 2,... formed on the crystal wafer 1 is recognized in advance. Specifically, in this case, laser irradiation regions for rough adjustment and fine adjustment on the crystal element 2 are determined.

Also, when the crystal wafer 1 is placed on the frequency adjustment table, firstly, a predetermined voltage is applied to the test electrodes 11, 12 of each crystal element 2, 2, ... formed on the crystal wafer 1 sequentially from a first crystal element 2 (e.g., a crystal element 2 at the upper left corner in FIG. 1) to excite each resonator. Thereafter, the resultant oscillation frequency is multiplied by the frequency multiplier. Based on the multiplied frequency signal, a frequency counter counts the oscillation frequency of each crystal element 2, 2, ... and the resultant count signal is transmitted to the controller. In the controller which has received the count signal, a calculation means (not shown) in the controller calculates a difference between the oscillation frequency of each crystal element 2, 2, . . . and the target frequency. As a result, an adjustment amount of oscillation frequency of each crystal element 2, 2, . . . is determined.

Laser Irradiation Step

An adjustment signal, which is based on the adjustment amount of oscillation frequency determined in the preparation of laser irradiation, is transmitted to a laser control means (not shown). The laser control means selects and determines a laser irradiation region to be subjected to laser irradiation for changing the oscillation frequency of each crystal element 2, 2, . . . formed on the crystal wafer 1 by the difference between the oscillation frequency and the target frequency. The laser irradiation instrument is controlled in accordance with the determination by the laser control means to perform laser irradiation continuously to the determined laser irradiation region (laser irradiation coordinates). As in the above-described frequency measurement, the laser irradiation instrument performs laser irradiation for each crystal element 2, 2, . . . formed on the crystal wafer 1 sequentially from a first crystal element 2 (e.g., a crystal element 2 at the upper left corner in FIG. 1).

Hereinafter, a specific embodiment of laser irradiation will be described with reference to FIG 5(*a*)-FIG 5(*d*), where frequency adjustment is performed for one crystal element 2 formed on the crystal wafer 1.

Rough Adjustment (Large Adjustment Amount) (Rough Adjustment Step as Referred Herein)

As shown in FIG. 5(*a*), laser irradiation is performed on an outer edge portion at a tip portion of the metal film 26 of the leg portion 21 in a thickness direction of the leg portion 21 so that the outer side surface metal film 26*a* is removed in the shape of a line along the thickness direction. Thereafter, from the outer edge portion (start point) on the outer side surface metal film 26*a*, laser irradiation is continued toward the inside of the leg portion 21 so that the metal films 26*b*, 26*c* formed on the top and bottom major surfaces of the leg portion 21 are removed in the shape of a line along a width direction. Thereafter, laser irradiation is performed in a thickness direction of the leg portion 21 toward an inner edge portion (end point) of the leg portion 21 so that the inner side surface metal film 26*d* is removed in the shape of a line along the thickness direction.

Figure 5A:
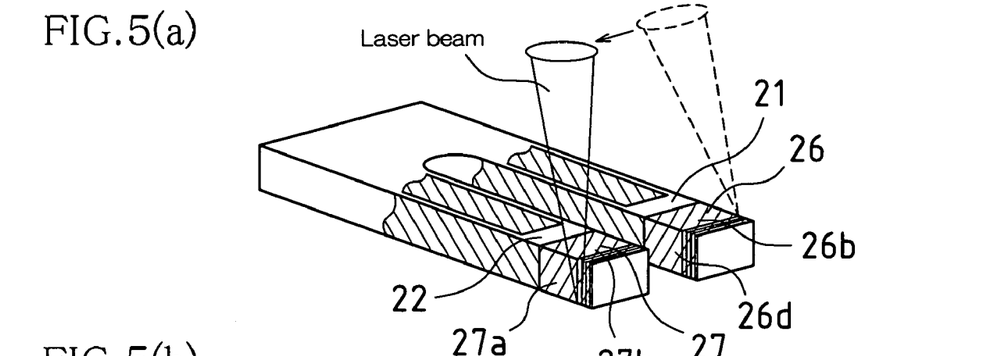
FIGS. 5(a) to (d) are diagrams schematically showing a tuning fork crystal element in a laser irradiation step according to an embodiment of the present invention.

In this case, laser irradiation by the laser irradiation instrument can be performed continuously from the tip portion of the metal film 26 on the leg portion 21 to a tip portion of the metal film 27 on the leg portion 22. Specifically, laser irradiation is performed on an inner edge portion at the tip portion of the metal film 27 of the leg portion 22 in a thickness direction of the leg portion 22 so that the inner side surface metal film 27*d* is removed in the shape of a line along the thickness direction. Thereafter, from the inner edge portion (start point) on the inner side surface metal film 27*d*, laser irradiation is continued toward the outside of the leg portion 22 so that the metal films 27*b*, 27*c* formed on the top and bottom major surfaces of the leg portion 22 are removed in the shape of a line along a width direction. Thereafter, laser irradiation is performed along a thickness direction of the leg portion 22 toward an outer edge portion (end point) of the leg portion 22 so that the outer side surface metal film 27*a* is removed in the shape of a line along the thickness direction.

As described above, the metal films 26, 27 of the leg portions 21, 22 are removed in the shape of a line along perimeters of the leg portions 21, 22, i.e., the top and bottom major surfaces and the both side surfaces (inner and outer side surfaces) by laser irradiation at one location (one time). With the one-location laser irradiation, the oscillation frequency can be adjusted by about 500 to 600 ppm.

First Fine Adjustment (intermediate adjustment amount, first fine frequency adjustment referred herein, and one of the fine adjustment steps)

Figure 5B:
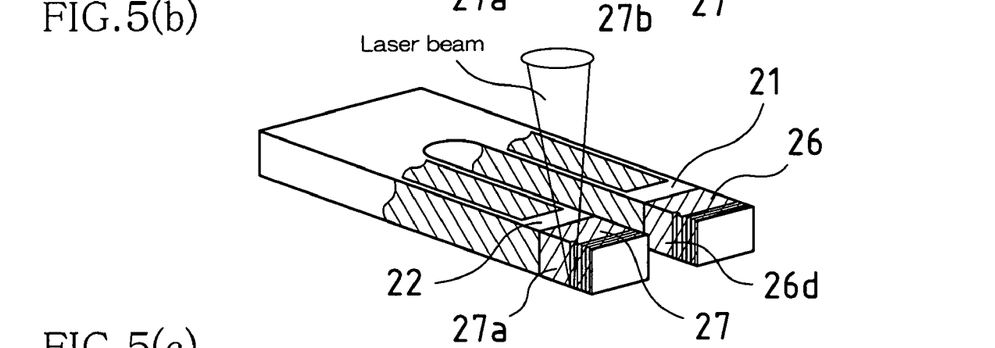

As shown in 5(*b*), any one or more of the inner and outer side surface metal films 26*a*, 26*d*, 27*a*, and 27*d* (see FIG. 3) of the leg portions 21, 22 are selected from the metal films 26, 27. Laser irradiation is performed on an edge portion of the selected side surface metal film of the leg portion 21, 22 in a thickness direction of the leg portion 21, 22 so that a portion of the leg portion 21, 22, which is located closer to the base portion 20 of the leg portion 21, 22 than the roughly adjusted region of the leg portion 21, 22 of FIG. 5(*a*), is removed in the shape of a line on the edge portion in a width direction of the leg portion 21, 22 in the thickness direction of the leg portion 21, 22.

Alternatively, as shown in FIG. 5(*c*), any one or more of the top and bottom major surface metal film 26*b*, 26*c*, 27*b*, and 27*c* (see FIG. 3) of the leg portions 21, 22 are selected from the metal films 26, 27. Laser irradiation is performed in a direction perpendicular to the selected top and bottom major surfaces of the leg portion 21, 22 so that a portion of the leg portion 21, 22, which is located closer to the base portion 20 of the leg portion 21, 22 than the roughly adjusted region of the leg portion 21, 22 of FIG. 5(*a*), is removed in the shape of a line along a width direction of the leg portion 21, 22.

Figure 5C:
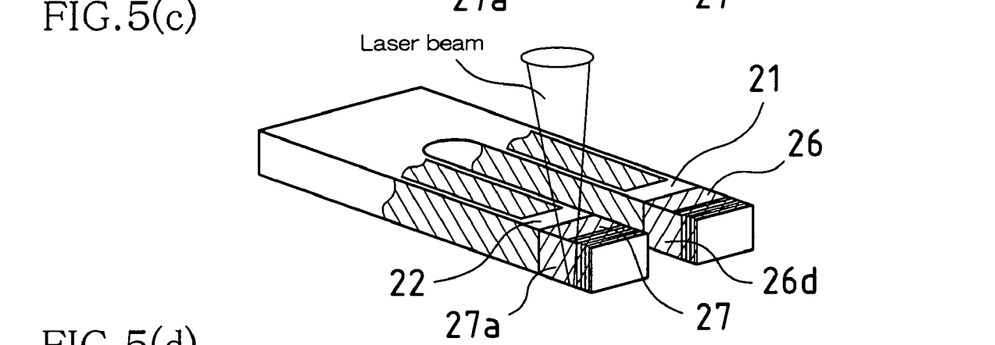

As described above, the metal film 26, 27 of the leg portion 21, 22 is removed in the shape of a line along the width or thickness direction of the leg portion 21, 22 by laser irradiation at one location (one time). In FIG. 5(*b*), each of the metal films 26*d* and 27*a* is removed in the shape of a line in the thickness direction at one location, so that the same number of linear portions are removed from each leg portions 21, 22. With the one-location laser irradiation, the oscillation frequency can be adjusted by about 100 to 150 ppm. It should be noted that the position of removal of a linear portion of each leg portions 21, 22 is not limited to the position of FIG. 5(*b*) and can be arbitrarily determined. For example, a linear portion may be removed in the thickness direction of the metal films 26*a* and 27*d* at one location for each. Also, the position of removal of a linear portion of each leg portions 21, 22 is not limited to the position of FIG. 5(*c*). For example, the removal position may be farther from the base portion 20 of each leg portion 21, 22 than the roughly adjusted region in FIG. 5(*c*).

Second Fine Adjustment (Small Adjustment Amount, Second Fine Frequency Adjustment Referred Herein, and One of the Fine Adjustment Steps)

Figure 5D:
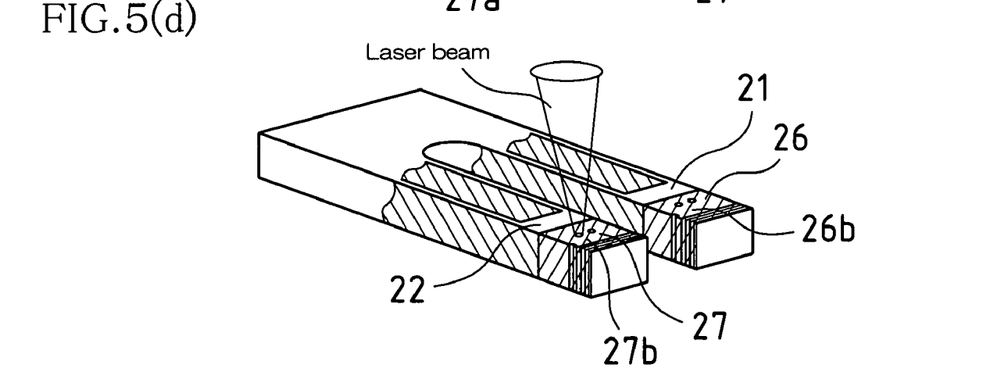

Any one or more of the top and bottom major surface metal films 26*b*, 26*c*, 27*b*, and 27*c* of the leg portions 21, 22 are selected from the metal films 26, 27. Laser irradiation is performed in a direction perpendicular to the selected major surface of the leg portion 21, 22 so that a dot portion of the leg portion 21, 22, which is located closer to the base portion 20 of the leg portion 21, 22 than the roughly adjusted region and the finely adjusted region of the leg portion 21, 22 of FIGS. 5(*b*), (*c*), is removed. In FIG. 5(*d*), removal of a dot portion is performed at two locations on each of the top and bottom major surface metal films 26*b*, 26*c* (not shown for 26*c*) and at two locations on each of the top and bottom major surface metal films 27*b*, 27*c* (not shown for 27*c*), so that the same number of dot portions are removed from each of the leg portions 21, 22. The oscillation frequency can be adjusted by about 50 to 75 ppm by the laser irradiation at one location. Although removal of a dot portion is performed at two locations on each of the top and bottom major surface metal films 26b, 26c and on each of the top and bottom major surface metal films 27b, 27c in 5(d), the present invention is not limited to this. The number of locations for removal of a dot portion can be arbitrarily changed depending on the frequency to be adjusted.

Specifically, the above-described adjustment of FIG. 5 is performed as follows. For example, it is assumed that the difference between the oscillation frequency and the target frequency is 1,700 ppm. Laser irradiation similar to that for rough adjustment (500 ppm at one location) is performed on the metal films 26, 27 of the leg portions 21, 22 three times, so that the current difference between the oscillation frequency and the target frequency is 200 ppm. Thus, the rough frequency adjustment is completed. Laser irradiation similar to the first fine adjustment (100 ppm at one location) is performed on each of the metal films 26, 27 of the leg portions 21, 22 once, so that there is no difference between the oscillation frequency and the target frequency. Thus, the fine frequency adjustment is completed. Alternatively, it is assumed that the difference between the oscillation frequency and the target frequency is 1,350 ppm. Laser irradiation similar to the rough adjustment (600 ppm at one location) is performed on the metal films 26, 27 of the leg portions 21, 22 twice, so that the current difference between the oscillation frequency and the target frequency is 150 ppm. Thus, the rough frequency adjustment is completed. Laser irradiation similar to the second fine adjustment (75 ppm at one location) is performed on each of the metal films 26, 27 of the leg portions 21, 22 once, so that there is no difference between the oscillation frequency and the target frequency. Thus, the fine frequency adjustment is completed.

Measurement Step

After the laser irradiation operation for each frequency adjustment has been completed, the oscillation frequencies of all of the crystal elements 2, 2, . . . are measured again. In the oscillation frequency measurement operation, frequency measurement is performed for each crystal element 2, 2, . . . on the same order as that for the above-described laser irradiation, i.e., sequentially from a first crystal element 2 (e.g., a crystal element 2 at the upper left corner in FIG. 1). Thus, it is determined whether or not the oscillation frequency of each crystal element 2, 2, . . . is equal to the target frequency. In this case, when the oscillation frequency is equal to the target frequency, the crystal wafer 1 is removed from the vacuum chamber and is transferred to a subsequent step. On the other hand, when the oscillation frequency is not equal to the target frequency, a frequency adjustment procedure similar to that described above is performed again.

In the above-described embodiment of the present invention, frequency adjustment is performed for all of the crystal elements 2 together on the crystal wafer 1, thereby making it possible to dramatically improve the production efficiency.

In the embodiment described herein, a combination of two patterns of fine adjustment is performed after the above-described rough adjustment step, resulting in more precise frequency adjustment with considerably high resolution. However, the above-described rough adjustment step and only one of the first fine adjustment and the second fine adjustment (fine adjustment step referred herein) can be performed depending on the closeness between the target frequency and the frequency before adjustment. Alternatively, only two patterns of fine frequency adjustment can be combined (fine adjustment step referred herein). Although all of the adjustment procedures (rough adjustment step, fine adjustment step) are performed depending on the predetermined frequency adjustment amount before the frequency measurement procedure is performed in the above-described embodiment, the frequency measurement procedure may be performed after each adjustment procedure is ended.

Figure 6:
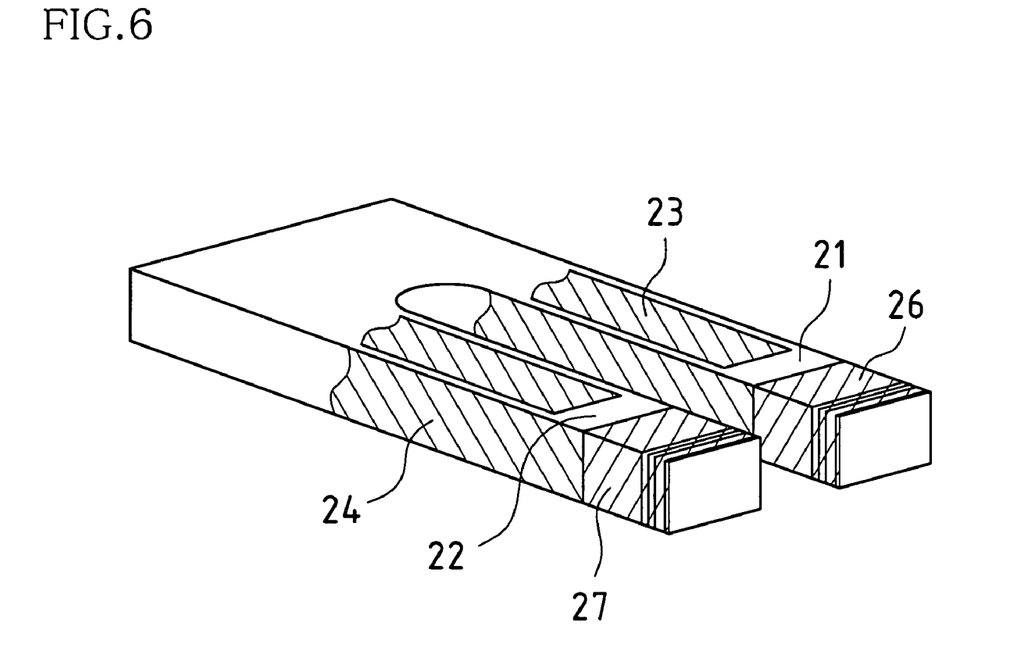
FIG. 6 is a diagram schematically showing a tuning fork crystal element, in which a width of a removed linear portion is changed, according to another embodiment of the present invention.

In the embodiment described herein, all linear portions have the same width as shown in FIG. 5. However, the present invention is not limited to this. For example, as shown in FIG. 6, the width of a linear portion may be changed. In this case, by changing the width of a linear portion, the frequency adjustment of the crystal element 2 can be achieved by a smaller number of times of laser irradiation. In this case, the setting of the frequency adjustment only includes changing the width of a linear portion, and therefore, the frequency adjustment amount can be easily changed.

Figure 7:
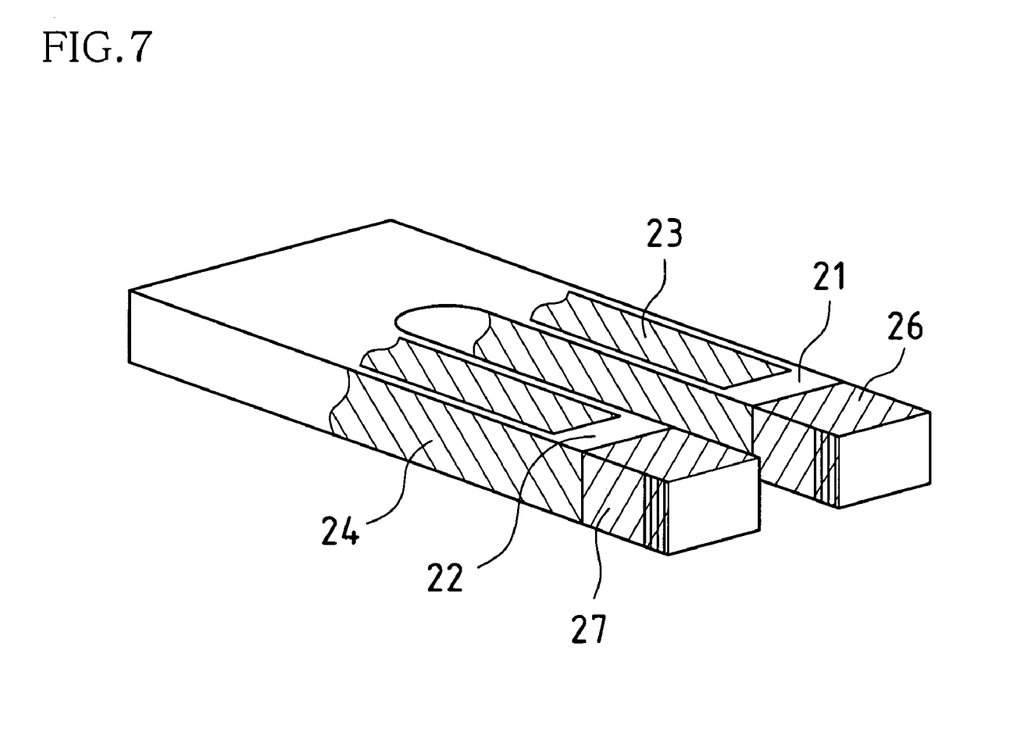
FIG. 7 is a diagram schematically showing a tuning fork crystal element, in which metal film formed on both side surfaces of each leg portion is removed in the shape of a line in a thickness direction, according to another embodiment of the present invention.

In the embodiment described herein, the rough adjustment step is performed before the fine adjustment, so that frequency adjustment is completed. The present invention is not limited to this. For example, the number and order of a rough adjustment step(s) and a fine adjustment step(s) may be arbitrarily determined (e.g., a rough adjustment step, a rough adjustment step, and a fine adjustment are performed in this order). Alternatively, only a rough adjustment step(s) or a fine adjustment step(s) may be performed. Specifically, as shown in FIG. 7, only the first fine adjustment step for removing a linear portion only of each of the inner and outer side surface metal films 26a, 26d, 27a, 27d of the leg portions 21, 22 may be performed.

In the fine adjustment step of the embodiment described herein, the first fine adjustment is performed before the second fine adjustment. The present invention is not limited to this. For example, the second fine adjustment may be performed before the first fine adjustment. Alternatively, only one of the first fine adjustment and the second fine adjustment may be performed. The first fine adjustment and the second fine adjustment may be performed simultaneously. Particularly when the first fine adjustment and the second fine adjustment may be performed simultaneously, the number of times of frequency measurement can be reduced as compared to when at least one of the first fine frequency adjustment and the second fine frequency adjustment is selectively performed, thereby making it possible to reduce the time required for the frequency adjustment procedure.

In the embodiment described herein, the metal films 26, 27 are formed on the tip portions of the leg portions 21, 22, respectively, as shown in FIGS. 2, 3. The present invention is not limited to the embodiment of FIGS. 2, 3. For example, as shown in FIG. 8, tip surface metal films 26e, 27e may be formed on tip surfaces of the tip portions of the leg portions 21, 22.

Figure 8:
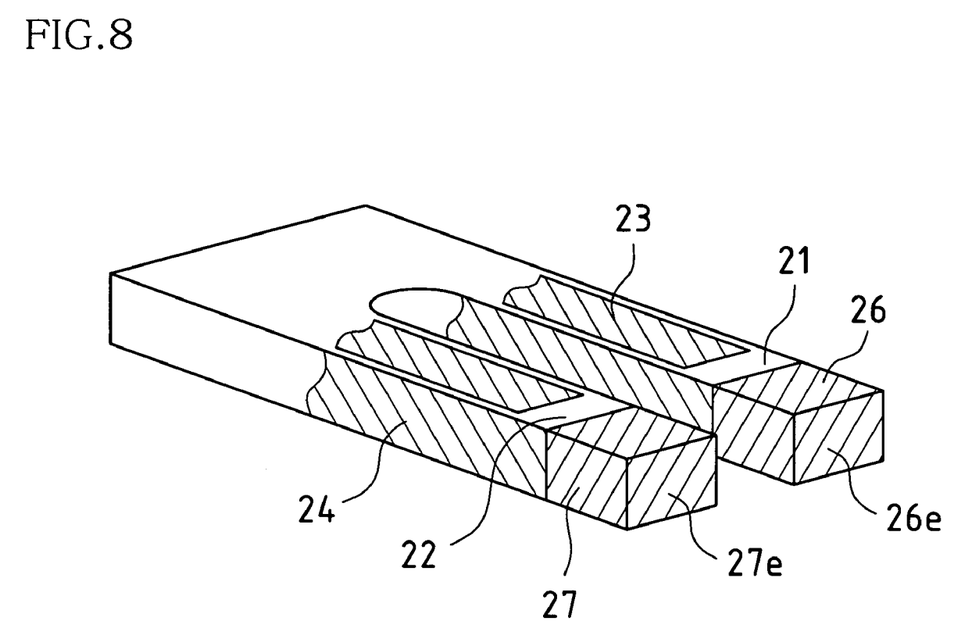
FIG. 8 is a diagram schematically showing a tuning fork crystal element, in which metal film is formed on a tip surface and both side surfaces of a tip portion of each leg portion, according to another embodiment of the present invention.
Figure 9:
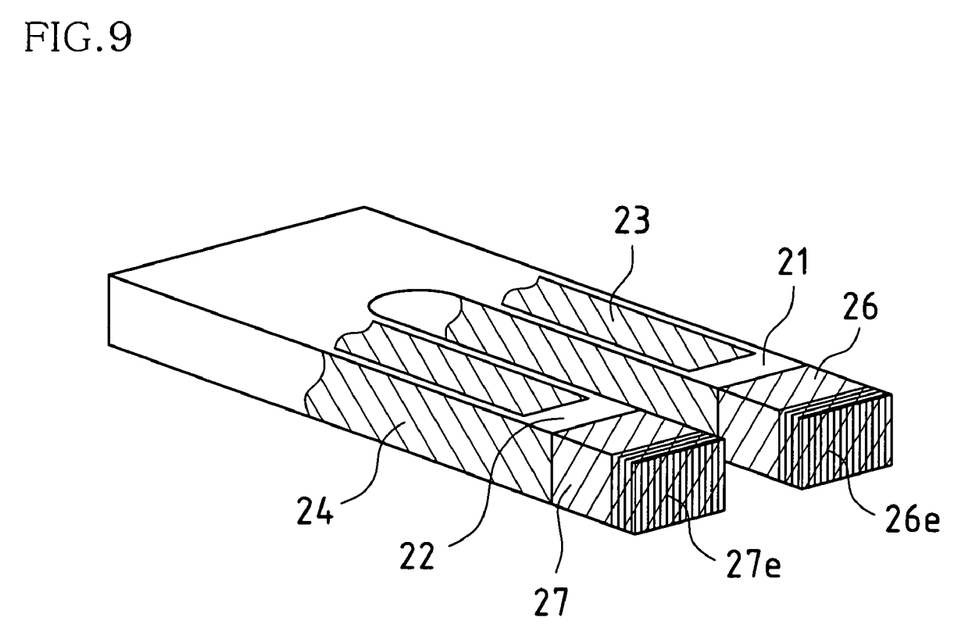
FIG. 9 is a diagram schematically showing a tuning fork crystal element, in which metal film formed on top and bottom major surfaces and both side surfaces of each leg portion is removed in the shape of a line along a perimeter of the leg portion, and metal film formed on a tip surface thereof is removed in the shape of a line in a thickness direction, according to another embodiment of the present invention.
Figure 10:
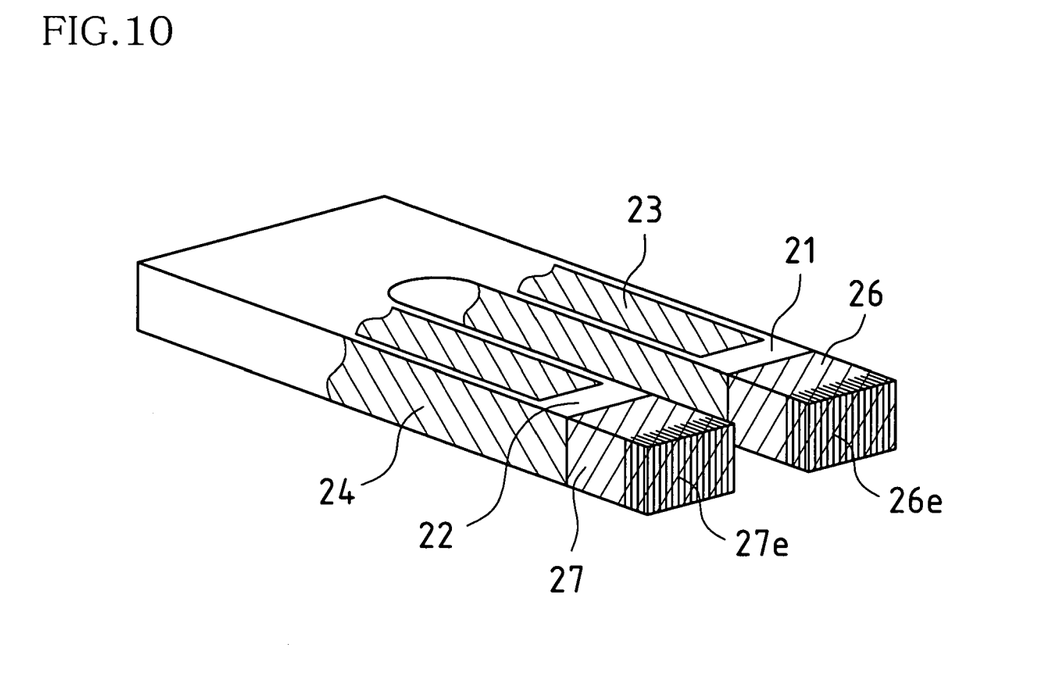
FIG. 10 is a diagram schematically showing a tuning fork crystal element, in which metal film formed on top and bottom major surfaces and a tip surface of each leg portion is removed in the shape of a line extending from the tip surface to the top and bottom major surfaces, and metal film formed on both side surfaces thereof is removed in the shape of a line in a thickness direction, according to another embodiment of the present invention.

When the metal films 26, 27 are formed at the tip portions of the leg portions 21, 22, respectively, as shown in FIG. 8, the metal films 26, 27 can be removed as shown in FIGS. 9, 10. Specifically, as shown in FIG. 9, in the metal films 26, 27 of the leg portions 21, 22, the top and bottom major surface metal films 26b, 26c, 27b, 27c and the inner and outer side surface metal films 26a, 26d, 27a, 27d of the leg portion 21, 22 are removed in the shape of a line along perimeters of the leg portions 21, 22, while the tip surface metal films 26e, 27e are removed in the shape of a line in the thickness direction (see FIG. 3). Alternatively, as shown in FIG. 10, in the metal films 26, 27 of the leg portions 21, 22, the top and bottom major surface metal films 26b, 26c, 27b, 27c and the tip surface metal films 26e, 27e of the leg portions 21, 22 are removed in the shape of a line extending from the tip surface to the top and bottom major surfaces of the leg portions 26, 27, and the inner and outer side surface metal films 26a, 26d, 27a, 27d are removed in the shape of a line in the thickness direction (see FIG. 3).

Figure 11:
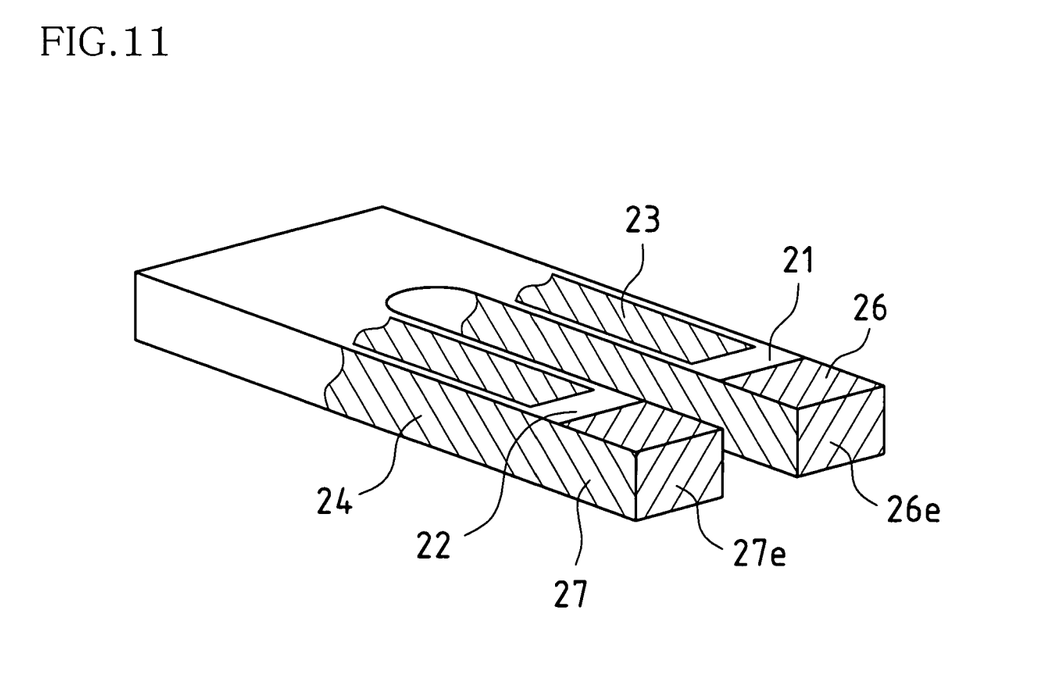
FIG. 11 is a diagram schematically showing a tuning fork crystal element, in which metal film is formed on a tip surface of a tip portion of each leg portion, according to another embodiment of the present invention.
Figure 12:
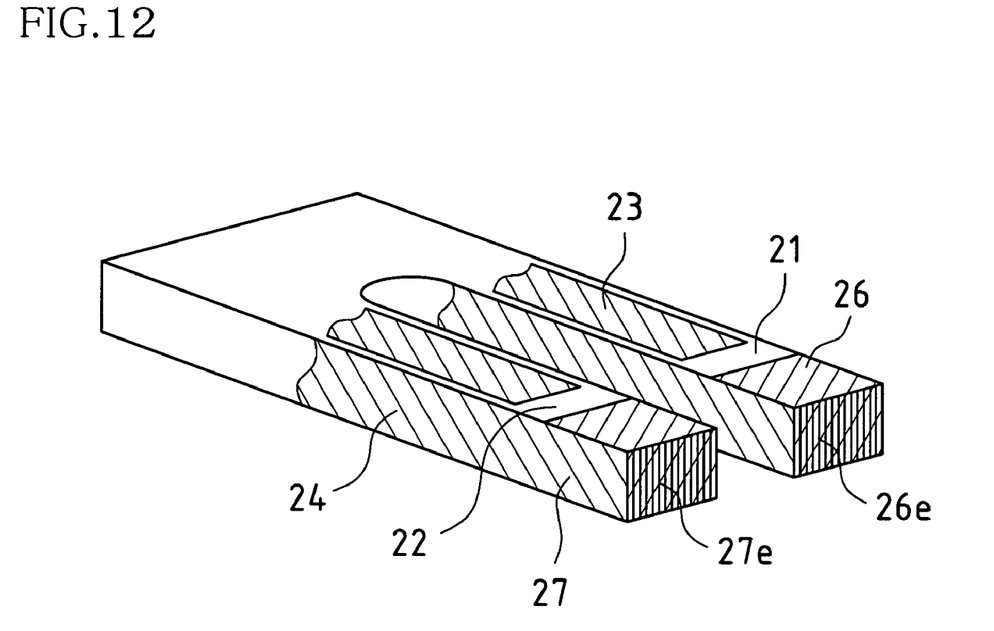
FIG. 12 is a diagram schematically showing a tuning fork crystal element, in which metal film formed on a tip surface of each leg portion is removed in the shape of a line in a thickness direction, according to another embodiment of the present invention.
Figure 13:
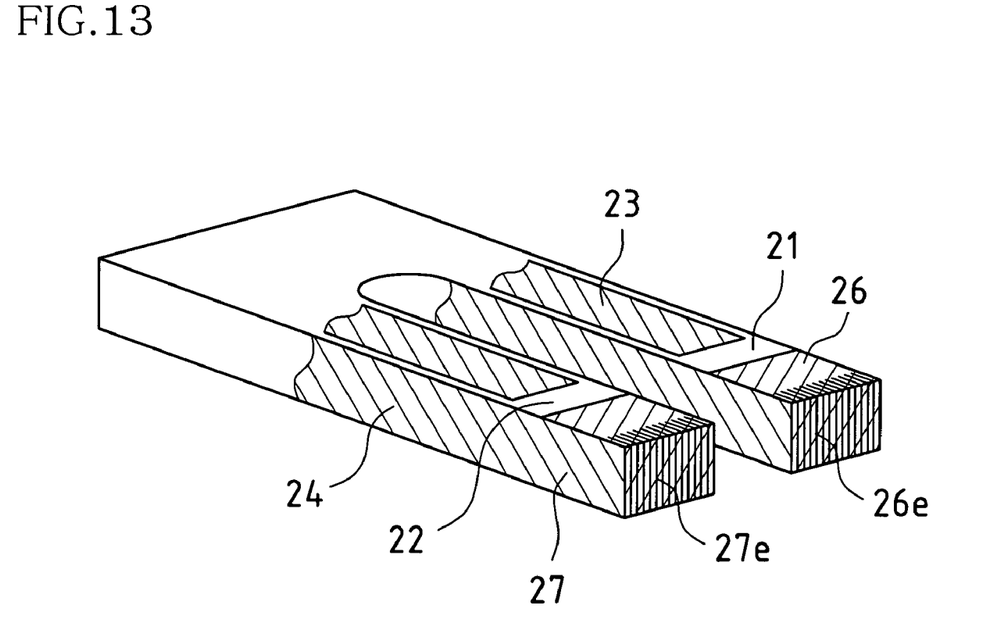
FIG. 13 is a diagram schematically showing a tuning fork crystal element, in which metal film formed on top and bottom major surfaces and a tip surface of each leg portion is removed in the shape of a line extending from the tip surface to the top and bottom major surfaces, according to another embodiment of the present invention.

In FIG. 2, the inner and outer side surface metal films 26a, 26d, 27a, 27d are formed on the leg portions 21, 22. The present invention is not limited to this For example, as shown in FIG 11, the tip surface metal films 26e, 27e may be formed on the tip portions of the leg portions 21, 22, respectively. In this case, as shown in FIG 12, the tip surface metal films 26e, 27e may be removed in the shape of a line in the thickness direction. Alternatively, as shown in FIG 13, the top and bottom major surface metal films 26b, 26c, 27b, 27c and the tip surface metal films 26e, 27e of the leg portions 21, 22 may be removed in the shape of a line extending from the tip surface to the top and bottom major surfaces of the leg portions 21, 22, respectively. It should be noted that removal of liner portions of the metal films 26, 27 show in FIGS. 12, 13 can be applied to the metal films 26, 27 of FIG 8.

Variations of the Embodiments Described Herein

Next, variations of the embodiments described herein will be described with reference to FIG. 14. In the above-described embodiments, a plurality of crystal element 2, 2, . . . are formed on the wafer 7, and each crystal element 2 is subjected sequentially to the frequency adjustment procedure before the crystal element 2 is cut off. In a variation, the above-described crystal element 2 is subjected to frequency adjustment after it is incorporated into a ceramic package 3. Although the package 3 is made of a ceramic in this variation, the present invention is not limited to this. Any other packages made of an insulator material can be used.

Figure 14:
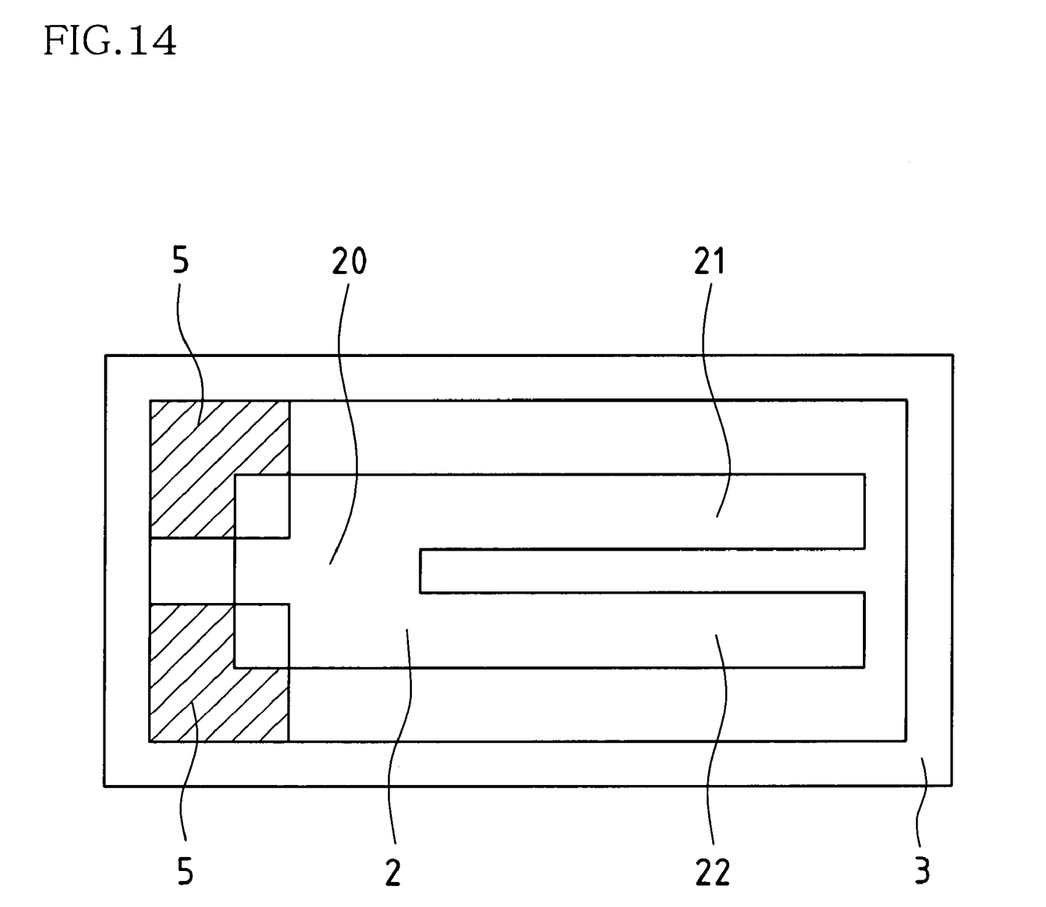
FIG. 14 is a plan view showing an internal configuration of a crystal resonator according to a variation of the embodiment of the present invention.

FIG. 14 is a plan view showing an internal configuration of a tuning fork resonator (hereinafter referred to as a crystal resonator) according to a variation of the embodiment of the present invention. As shown in FIG. 14, the crystal resonator includes a crystal element 2, a ceramic package 3, and a lead electrode 5. The ceramic package 3 is in the shape of a box with an opening on a top thereof. The ceramic package 3 is provided with an electrode line (not shown) at a predetermined position. The lead electrode 5 is connected to first and second drive electrodes 23, 24 (e.g., see FIG. 2) of the crystal element 2, and supports a base portion 20 of the crystal element 2. Further, a planar cap (not shown) is attached to an upper portion of the ceramic package 3 to cover the crystal element 2, thereby hermetically sealing the tuning fork crystal element 2.

For the crystal resonator of this variation, the crystal element 2 formed on the ceramic package 3 is subjected to laser irradiation by a laser irradiation instrument as in the above-described embodiments. The laser irradiation operation is performed as in the above-described embodiments, i.e., after a laser irradiation region for changing the oscillation frequency of the crystal element 2 by a difference between the oscillation frequency and a target frequency is determined in advance. After laser irradiation, the oscillation frequency is measured. Finally, frequency adjustment is performed.

According to the crystal resonator of the variation, different fine adjustment (e.g., milling, partial deposition, etc.) can be performed at a subsequent step, depending on the closeness between a target frequency and a frequency before adjustment.

In the above-described embodiments, more precise frequency adjustment having a considerably high resolution is achieved by a combination of three patterns of fine frequency adjustment with laser irradiation. By combining the frequency adjusting method of the above-described embodiment with the frequency adjusting method of the variation, more precise frequency adjustment can be achieved.

The present invention can be embodied and practiced in other different forms without departing from the spirit and essential characteristics thereof. Therefore, the above-described embodiments are considered in all respects as illustrative and not restrictive. The scope of the invention is indicated by the appended claims rather than by the foregoing description. All variations and modifications falling within the equivalency range of the appended claims are intended to be embraced therein.

This application claims priority on Patent Application No. 2003-090067 filed in Japan on Mar. 28, 2003, the entire contents of which are hereby incorporated by reference.

INDUSTRIAL APPLICABILITY

The present invention is preferably used to improve the efficiency of adjusting the oscillation frequency of a tuning fork resonator by removing a portion of metal film, which is formed as a weight for frequency adjustment on the piezoelectric element, such as a tuning fork element or the like, by irradiation of a beam (a laser beam, an electron beam, etc.). Particularly, it is considerably efficient and preferable that frequency adjustment is performed for each of small piezoelectric elements integrally formed on a wafer (a crystal wafer, etc.) before the piezoelectric elements are cut off from the wafer. Further, the present invention is preferable, particularly when the tuning fork resonator is a crystal resonator.

The invention claimed is:

1. A. frequency adjusting method for a tuning fork resonator,
   wherein the timing fork resonator comprises a piezoelectric element, the piezoelectric element including a base portion, a plurality of leg portions, a drive electrode formed on each of the leg portions, and a metal film for frequency adjustment formed on each of the leg portions,
   wherein the metal film formed on each of the leg portions is connected to a corresponding one of the drive electrodes,
   wherein an oscillation frequency of the tuning fork resonator can be adjusted by removing a portion of the metal film by beam irradiation, and
   wherein each of the leg portions has a tip portion including a front major surface, a back major surface, side surfaces and a tip surface, the metal film being formed on at least one of the side surfaces of the tip portion or the tip surface of the tip portion,
   the frequency adjustment method comprising removing a portion of the metal film formed on the at least one of the side surfaces of the tip portion or the tip surface of the tip portion.

2. The frequency adjusting method for a tuning fork resonator according to claim 1,
   wherein, for each of the tip portions, the metal film is formed on at least one of the side surfaces of the tip portion, and said removing of a portion of the metal film comprises performing beam irradiation on an edge portion of the at least one of the side surfaces of the tip portion on which the metal film is formed in a thickness direction of the leg portion so that the metal film fanned on the at least one of the side surfaces of the tip portion is removed in the shape of a line along the thickness direction.

3. The frequency adjusting method for a tuning fork resonator according to claim 2, wherein a width of the line is changed.

4. The frequency adjusting method for a tuning fork resonator according to claim 1,
wherein, for each of the tip portions, the metal film is formed on the side surfaces of the tip portion and the front and back major surfaces of the tip portion, and said removing of a portion of the metal film comprises performing a rough frequency adjustment by beam irradiation from one of the side surfaces of the tip portion in a width direction of the leg portion via the top and bottom major surfaces of the tip portion to the other of the side surfaces of the tip portion so that the metal film formed on the side surfaces of the tip portion and the front and back major surfaces of the tip portion is removed in the shape of a line along a perimeter of the leg portion on the top and bottom major surfaces of the tip portion and the side surfaces of the tip portion.

5. The frequency adjusting method for a tuning fork resonator according to claim 4, further comprising:
performing one or more of a first fine frequency adjustment for removing a portion of the metal film formed on one or more of the side surfaces of the tip portion and the front and back major surfaces of the tip portion in the shape of a line, and a second fine frequency adjustment for removing a portion of the metal film formed on one or more of the front and back major surfaces of the tip portion in the shape of a dot.

6. The frequency adjusting method for a tuning fork resonator according to claim 5,
wherein the first fine frequency adjustment of removing a. portion of the metal film formed on one or more of the side surfaces of the tip portion and the front and back major surfaces of the tip portion in the shape of a line is performed on a portion of the metal film that is disposed closer to the base portion of the piezoelectric element than the portion of the metal film that is removed in the rough frequency adjustment, and
wherein the second fine frequency adjustment of removing a portion of the metal film formed on one or more of the front and back major surfaces of the tip portion in the shape of a dot is performed on a portion of the metal film that is disposed closer to the base portion of the piezoelectric element than the portion of the metal film that is removed in rough frequency adjustment.

7. The frequency adjusting method for a tuning fork resonator according to claim 4, further comprising:
performing a first fine frequency adjustment for removing a portion of the metal film formed on one or more of the side surfaces of the tip portion and the front and back major surfaces of the tip portion in the shape of a line; and
performing a second fine frequency adjustment for removing a portion of the metal film formed on one or more of the front and back major surfaces of the tip portion in the shape of a dot,
wherein the first fine frequency adjustment and the second fine frequency adjustment are performed simultaneously.

8. The frequency adjusting method for a tuning fork resonator according to claim 7,
wherein the first fine frequency adjustment of removing a portion of the metal film formed on one or more of the tip surface of the tip portion and the front and back major surfaces of the tip portion in the shape of a finals performed on a portion of the metal film that is disposed closer to the base portion of the piezoelectric element than the portion of the metal film that is removed in the rough frequency adjustment and
wherein the second fine frequency adjustment of removing a portion of the metal film formed on one or more of the front and back major surfaces of the tip portion in the shape of a dot is performed on a portion of the metal film that is closer to the base portion of the piezoelectric element than the portion of the metal film that is removed in the rough frequency adjustment.

9. The frequency adjusting method for a tuning fork resonator according to claim 1,
wherein, for each of the tip portions, the metal film is formed on the tip surface of the tip portion, and said removing of a portion of the metal film comprises performing beam irradiation on an edge portion of the tip portion of the leg portion in a thickness direction of the leg portion so that the metal film formed on the tip surface of the tip portion is removed in the shape of a line in the thickness direction.

10. The frequency adjusting method for a tuning fork resonator according to claim 1,
wherein, for each of the tip portions, the metal film is formed on the tip surface of the tip portion and the front and back major surfaces of the tip portion, and said removing of a portion of the metal film comprises performing a rough frequency adjustment by beam irradiation of the tip surface of the tip portion and the top and bottom major surfaces of the tip portion so that the metal film formed on the tip surface of the tip portion and the front and back major surfaces of the portion is removed in the shape of a line extending on the top and bottom major surfaces of the tip portion and the tip surface of the tip portion.

11. The frequency adjusting method for a tuning fork resonator according to claim 10, further comprising:
performing one or more of a first fine frequency adjustment for removing a portion of the metal film formed on one or more of the tip surface of the tip portion and the front and back major surfaces of the tip portion in the shape of a. line, and a second fine frequency adjustment for removing a portion of the metal film formed on one or more of the front and major back surfaces of the tip portion in the shape of a dot.

12. The frequency adjusting method for a tuning form resonator according to claim 11,
wherein the first fine frequency adjustment of removing a portion of the metal film formed on one or more of the tip surface of the tip portion and the front and back major surfaces of the Tip portion in the shape of a line is performed on a portion of the metal film that is disposed closer to the base portion of the piezoelectric element than the portion of the metal film that is removed in the rough frequency adjustment, and
wherein the second fine frequency adjustment of removing a portion of the metal film formed on one or more of the front and back major surfaces of the tip portion in the shape of a dot is performed on a portion of the metal film that is disposed closer to the base portion of the piezoelectric element than the portion of the metal film that is removed in the rough frequency adjustment.

13. The frequency adjusting method for a tuning fork resonator according to claim 10, further comprising:
performing a first fine frequency adjustment for removing a portion of the metal film formed on one or more of the tip surface of the tip portion and the front and back major surfaces of the tip portion in the shape of a line; and performing a second fine frequency adjustment for removing a portion of the metal film formed on one or more of the front and back major surfaces of the tip portion in the shape of a dot, wherein the first fine frequency adjustment and the second fine frequency adjustment are performed simultaneously.

14. The frequency adjusting method for a tuning fork resonator according to claim 13, wherein the first fine frequency adjustment of removing a portion of the metal film formed on one or more of the tip surface of the tip portion and the front and back major surfaces of the tip portion in the shape of a line is performed on a portion of the metal film that is disposed closer to the base portion of the piezoelectric element than the portion of the metal film that is removed in the rough frequency adjustment, and wherein the second fine frequency adjustment of removing a portion of the metal film formed on one or more of the front and back major surfaces of the tip portion in the shape of a dot is performed on a portion of the metal film that is disposed closer to the base portion of the piezoelectric element than the portion of the metal film that is removed in the rough frequency adjustment.

15. A tuning fork resonator, wherein the tuning fork resonator is subjected to frequency adjustment by the frequency adjusting method for a tuning fork resonator according to claim 1.

* * * * *